(12) United States Patent
Furuno (10) Patent No.: US 12,388,158 B2
(45) Date of Patent: Aug. 12, 2025

(54) POWER SUPPLY SYSTEM AND CONNECTION STRUCTURE BETWEEN CONNECTION TERMINAL AND BUSBAR

(71) Applicant: Murata Manufacturing Co., Ltd., Nagaokakyo (JP)

(72) Inventor: Masataka Furuno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 492 days.

(21) Appl. No.: 18/080,788

(22) Filed: Dec. 14, 2022

(65) Prior Publication Data

US 2023/0113441 A1  Apr. 13, 2023

Related U.S. Application Data

(63) Continuation of application No. PCT/JP2021/026200, filed on Jul. 13, 2021.

(30) Foreign Application Priority Data

Jul. 27, 2020  (JP) .................................. 2020-126077

(51) Int. Cl.
  *H01M 50/507*  (2021.01)
  *H01M 50/503*  (2021.01)

(52) U.S. Cl.
  CPC ....... *H01M 50/507* (2021.01); *H01M 50/503* (2021.01)

(58) Field of Classification Search
  CPC .......................... H01M 50/507; H01M 50/503
  See application file for complete search history.

(56) References Cited

U.S. PATENT DOCUMENTS

| | | | | |
|---|---|---|---|---|
| 10,950,915 | B2* | 3/2021 | Nakayama | H01M 50/507 |
| 2010/0266889 | A1 | 10/2010 | Kim | |
| 2014/0205889 | A1 | 7/2014 | Kim et al. | |
| 2019/0198849 | A1 | 6/2019 | Nakayama et al. | |
| 2019/0379015 | A1* | 12/2019 | Ochi | H01M 50/505 |
| 2021/0226304 | A1 | 7/2021 | Suzuki | |

FOREIGN PATENT DOCUMENTS

| | | |
|---|---|---|
| JP | 05159822 A | 6/1993 |
| JP | 2013005570 A | 1/2013 |
| JP | 2014138000 A | 7/2014 |
| JP | 2018041543 A | 3/2018 |
| WO | 2020008681 A1 | 1/2020 |
| WO | 2020035970 A1 | 2/2020 |

OTHER PUBLICATIONS

International Search Report in PCT/JP2021/026200, mailed Sep. 28, 2021, 3 pages.
Written Opinion in PCT/JP2021/026200, mailed Sep. 28, 2021, 4 pages.

\* cited by examiner

*Primary Examiner* — Susan D Leong
(74) *Attorney, Agent, or Firm* — Keating & Bennett, LLP (57) ABSTRACT

In a power supply system, a first busbar is positioned such that a surface of a first terminal portion is in indirect contact with a first connection terminal and a surface of a second terminal portion of a second busbar is in direct contact with a second connection terminal. A joint portion of the first busbar and a joint portion of the second busbar sandwich the first and second connection terminals in a direction parallel or substantially parallel to surfaces of the first and second connection terminals.

17 Claims, 7 Drawing Sheets

POWER SUPPLY SYSTEM AND CONNECTION STRUCTURE BETWEEN CONNECTION TERMINAL AND BUSBAR

CROSS REFERENCE TO RELATED APPLICATIONS

This application claims the benefit of priority to Japanese Patent Application No. 2020-126077 filed on Jul. 27, 2020 and is a Continuation application of PCT Application No. PCT/JP2021/026200 filed on Jul. 13, 2021. The entire contents of each application are hereby incorporated herein by reference.

BACKGROUND OF THE INVENTION

1. Field of the Invention

The present invention relates to a connection structure between a busbar and a terminal and to a power supply system including the connection structure.

2. Description of the Related Art

Japanese Unexamined Patent Application Publication No. 2013-5570 describes a configuration in which a plurality of power supply modules are connected by two types of busbars. The plurality of power supply modules are arrayed in a predetermined pattern. The two types of busbars are selectively used in accordance with a shape of a connection portion in this arrayed pattern.

However, in the configuration described in Japanese Unexamined Patent Application Publication No. 2013-5570, since there is a plurality of types of busbars having different configurations and different attachment methods, a connecting operation is complicated.

SUMMARY OF THE INVENTION

Preferred embodiments of the present invention provide connection structures each connecting a busbar and a terminal, which each facilitate work efficiency of a connection.

A power supply system according to a preferred embodiment of the present invention includes a plurality of power supply modules positioned side by side in order of a first power supply module, a second power supply module, and a third power supply module in a predetermined direction, a first busbar, and a second busbar. The first busbar connects the first power supply module and the second power supply module. The second busbar connects the second power supply module and the third power supply module. The first power supply module includes a first connection terminal including a first surface orthogonal or substantially orthogonal to the predetermined direction. The second power supply module includes a second connection terminal including a second surface orthogonal or substantially orthogonal to the predetermined direction. The third power supply module includes a third connection terminal including a third surface orthogonal or substantially orthogonal to the predetermined direction.

Each of the first busbar and the second busbar includes a first terminal portion and a second terminal portion each including a pair of surfaces opposed to each other, and a joint portion connecting the first terminal portion and the second terminal portion such that the surface of the first terminal portion and the surface of the second terminal portion face each other. The first busbar is positioned such that the surface of the first terminal portion of the first busbar is in contact with the first surface of the first connection terminal and another surface of the second terminal portion of the first busbar is in direct or indirect contact with the second surface of the second connection terminal. The second busbar is positioned such that the surface of the first terminal portion of the second busbar is in direct or indirect contact with the second surface of the second connection terminal and another surface of the second terminal portion of the second busbar is in direct or indirect contact with the third surface of the third connection terminal. The joint portion of the first busbar and the joint portion of the second busbar sandwich the first connection terminal, the second connection terminal, and the third connection terminal in a direction parallel or substantially parallel to the first surface.

In this configuration, a plurality of power supply modules are connected by a plurality of busbars in which a positional relationship between the first terminal portion and the second terminal portion is the same.

According to preferred embodiments of the present invention, a connecting operation between the busbar and the terminal can be facilitated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

A power supply system according to a first preferred embodiment of the present invention will be described with reference to the accompanying drawings. In the present preferred embodiment, the power supply system will be described as an example. However, as long as a connection structure in which a plurality of power supply modules arrayed at predetermined intervals are connected by a plurality of busbars is included, the following configuration and advantageous operational effects are applicable not only to the power supply system.

Structure of Busbar 10

Figure 1A:
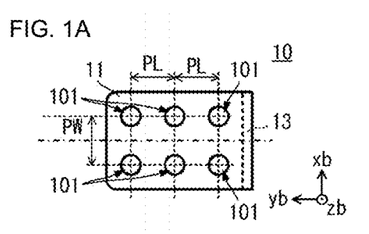
FIGS. 1A to 1E are five-sided views of a busbar according to a first preferred embodiment of the present invention.
Figure 1B:
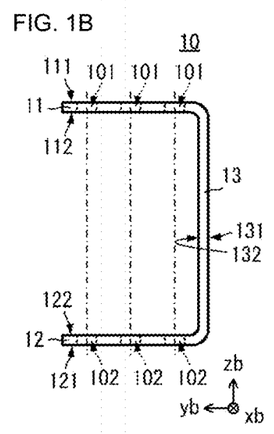
Figure 1C:
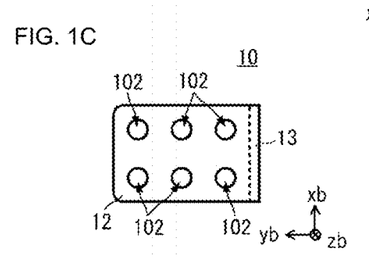
Figure 1D:
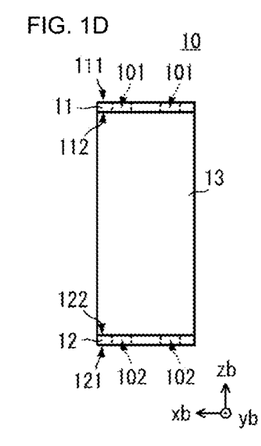
Figure 1E:
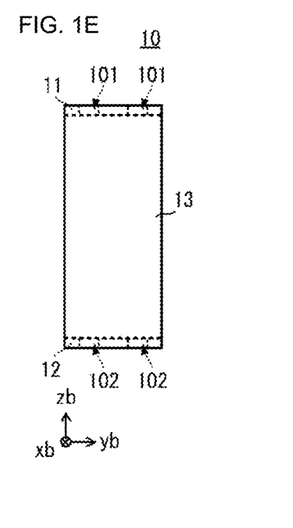
Figure 2:
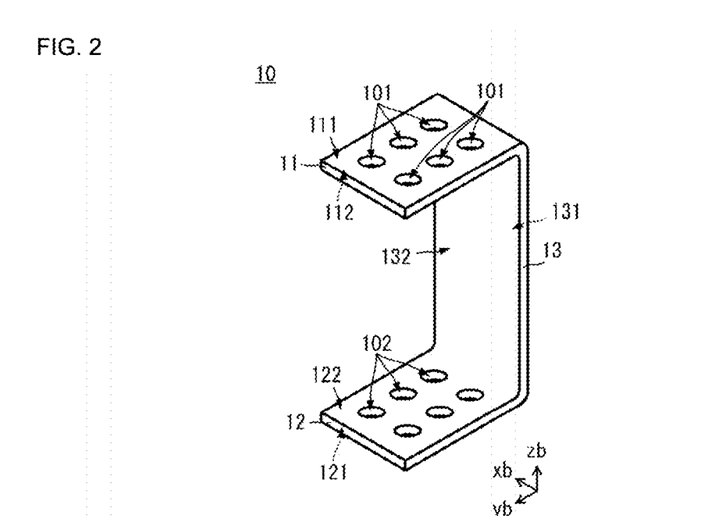
FIG. 2 is an external perspective view of the busbar according to the first preferred embodiment of the present invention.

FIGS. 1A to 1E are five-sided views of a busbar according to the first preferred embodiment. FIG. 1A is a first plan view, FIG. 1B is a first side view, FIG. 1C is a second plan view, FIG. 1D is a second side view, and FIG. 1E is a third side view. FIG. 2 is an external perspective view of the busbar according to the first preferred embodiment.

As illustrated in FIGS. 1 and 2, a busbar 10 includes a first terminal portion 11, a second terminal portion 12, and a joint portion 13. The first terminal portion 11 and the second terminal portion 12 are connected by the joint portion 13. The first terminal portion 11, the second terminal portion 12, and the joint portion 13 are integrally provided.

The first terminal portion 11 is a rectangular or substantially rectangular flat plate and includes a flat plate surface 111 and a flat plate surface 112 that are parallel or substantially parallel to an xb-axis direction and a yb-axis direction. The first terminal portion 11 has a thickness direction in a zb-axis direction.

A plurality of through holes 101 are provided in the first terminal portion 11. The plurality of through holes 101 are arrayed in the xb-axis direction and in the yb-axis direction. The plurality of through holes 101 are arranged in three columns in the yb-axis direction and two rows in the xb-axis direction. The plurality of through holes 101 are arranged at an interval PL in the yb-axis direction and arranged at an interval PW in the xb-axis direction. Among the plurality of through holes 101, a first set and a second set of three through holes 101 arranged in the yb-axis direction are arranged in line symmetry with respect to a center line of the first terminal portion 11 parallel to the yb-axis direction. The number and arrangement of the through holes 101 are not limited thereto.

The second terminal portion 12 is a rectangular or substantially rectangular flat plate and includes a flat plate surface 121 and a flat plate surface 122 that are parallel or substantially parallel to the xb-axis direction and the yb-axis direction. That is, the second terminal portion 12 has a thickness direction in the zb-axis direction.

A plurality of through holes 102 are provided in the second terminal portion 12. The plurality of through holes 102 are arrayed in the xb-axis direction and in the yb-axis direction. The plurality of through holes 102 are arranged in three columns in the yb-axis direction and two rows in the xb-axis direction. An arrangement pattern of the plurality of through holes 102 with respect to the second terminal portion 12 is the same or substantially the same as an arrangement pattern of the plurality of through holes 101 with respect to the first terminal portion 11. The number and arrangement of the through holes 102 are not limited thereto, but are the same or substantially the same as the number and the arrangement of the through holes 101.

The joint portion 13 is a rectangular or substantially rectangular flat plate and includes a flat plate surface 131 and a flat plate surface 132 that are parallel or substantially parallel to the xb-axis direction and the zb-axis direction. That is, the joint portion 13 has a thickness direction in the yb-axis direction. The flat plate surface 131 and the flat plate surface 132 of the joint portion 13 are thus orthogonal or substantially orthogonal to the flat plate surface 111 and the flat plate surface 112 of the first terminal portion 11 and the flat plate surface 121 and the flat plate surface 122 of the second terminal portion 12.

The joint portion 13 is connected to one end portion of the first terminal portion 11 in the yb-axis direction and is connected to one end portion of the second terminal portion 12 in the yb-axis direction.

The first terminal portion 11 and the second terminal portion 12 overlap each other in plan view. At this time, the plurality of through holes 101 and the plurality of through holes 102 are located at the same or substantially the same position in plan view.

The flat plate surface 112 of the first terminal portion 11 and the flat plate surface 122 of the second terminal portion 12 face each other. The flat plate surface 132 of the joint portion 13 faces a first terminal portion 11 side and a second terminal portion 12 side.

The busbar 10 having such a shape can be provided from, for example, a single rectangular or substantially rectangular flat plate having a predetermined rigidity. The busbar 10 can be formed by bending the flat plate to approximately 90° at two positions in the middle in a longitudinal direction.

Configuration of Power Supply System

Figure 3:
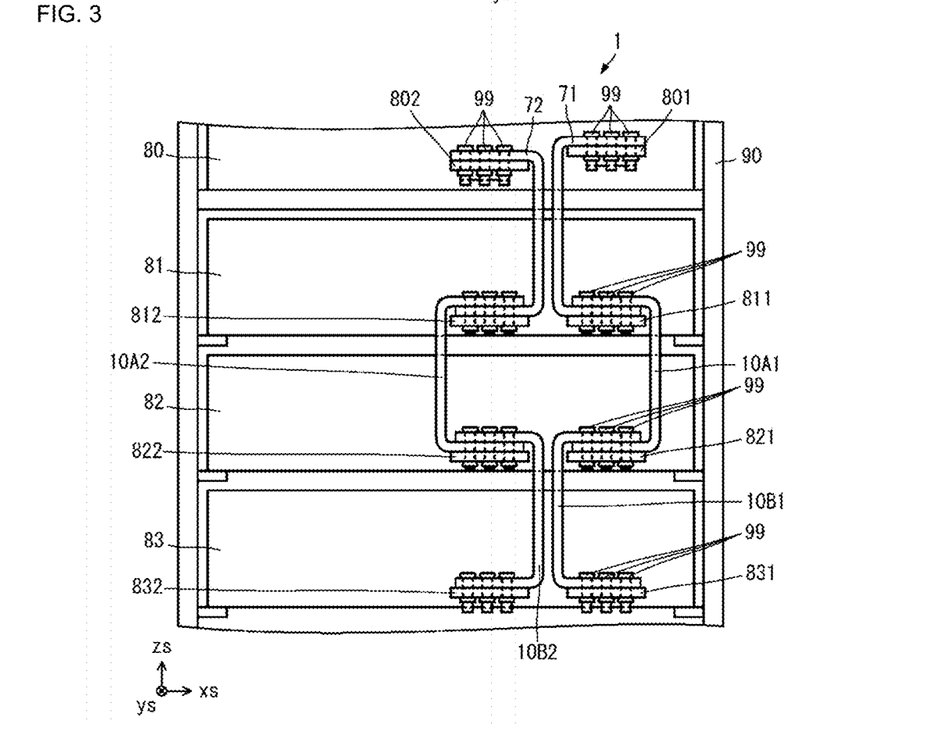
FIG. 3 is a diagram illustrating a portion of a configuration of a power supply system according to the first preferred embodiment of the present invention.
Figure 4A:
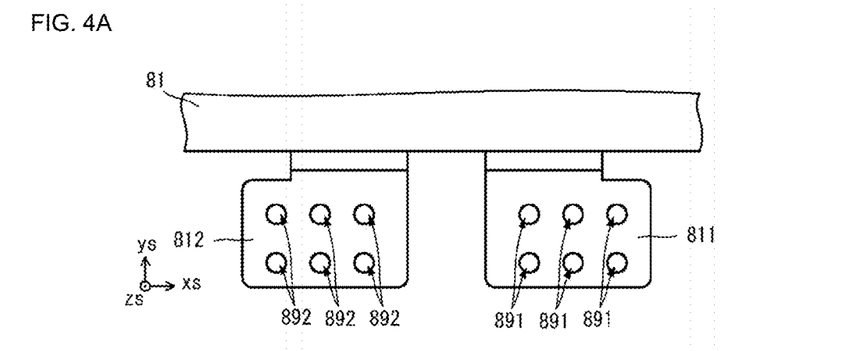
FIGS. 4A and 4B are diagrams illustrating a forming portion of a connection terminal in a battery module used in the power supply system.
Figure 4B:
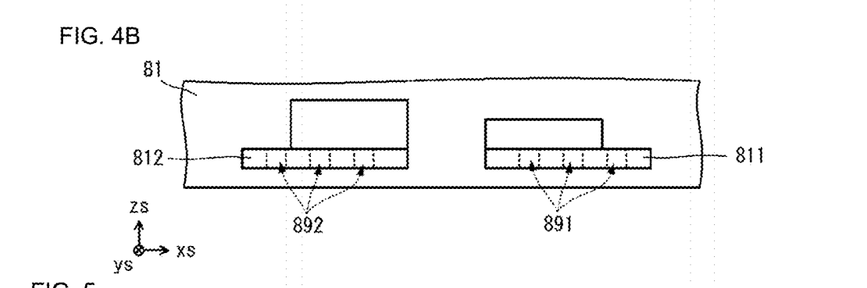
Figure 5:
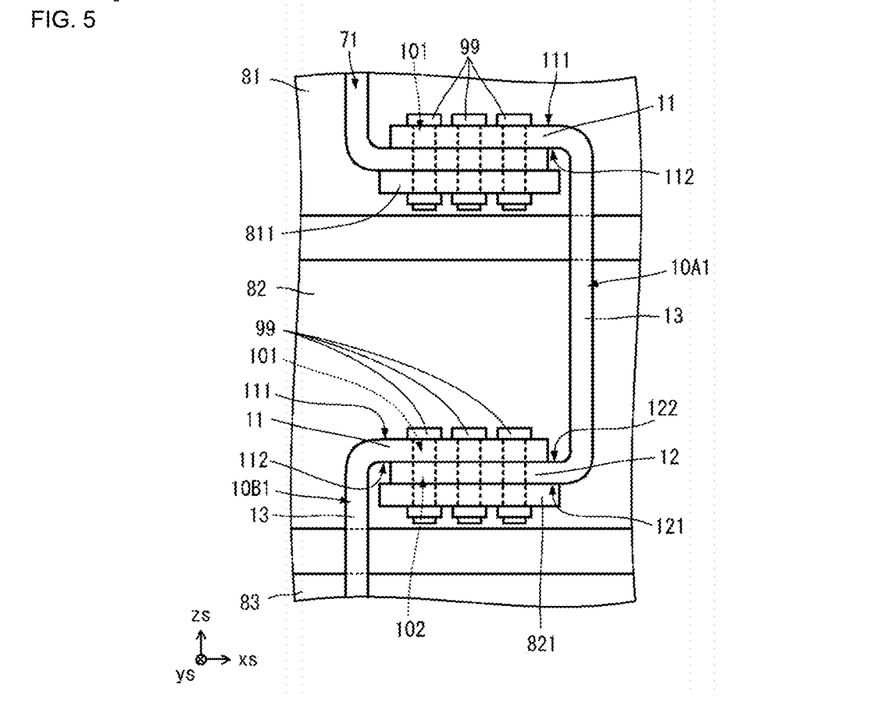
FIG. 5 is an enlarged view of a connection structure between the busbar and the connection terminal according to the first preferred embodiment of the present invention.

FIG. 3 is a diagram illustrating a portion of a configuration of the power supply system according to the first preferred embodiment of the present invention. FIGS. 4A and 4B are diagrams illustrating a forming portion of a connection terminal in a battery module used in the power supply system. The connection terminal is, for example, a terminal which a voltage is input to or output from. The connection terminal and the busbar are electrically connected to each other. FIG. 5 is an enlarged view of a connection structure between the busbar and the connection terminal.

As illustrated in FIG. 3, the power supply system includes a power module 80, a plurality of battery modules, and a plurality of busbars. The plurality of battery modules correspond to "power supply modules". Here, an example is described in which a battery module 81, a battery module 82, and a battery module 83 are provided as the plurality of battery modules, and a power supply busbar 71, a power supply busbar 72, a busbar 10A1, a busbar 10A2, a busbar 10B1, and a busbar 10B2 are provided as the plurality of busbars. Each of the busbar 10A1 and the busbar 10A2 corresponds to "first busbar", and each of the busbar 10B1 and the busbar 10B2 corresponds to "second busbar".

Each of the power module 80, the battery module 81, the battery module 82, and the battery module 83 includes a housing having a rectangular or substantially rectangular parallelepiped shape and is arrayed and installed with respect to a rack 90. More specifically, along a vertical direction (zs-axis direction), the power module 80, the battery module 81, the battery module 82, and the battery module 83 are arranged in this order from the upper side so as to be separated from each other by a predetermined distance.

The power module 80 internally includes a power supply circuit and the like. Each of the battery module 81, the battery module 82, and the battery module 83 includes a capacitor for power storage and the like.

The power module 80 includes a connection terminal 801 and a connection terminal 802 each having a flat plate shape. A flat plate surface of each of the connection terminal 801 and the connection terminal 802 is orthogonal or substantially orthogonal to the vertical direction (zs-axis direction). In other words, the connection terminal 801 and the connection terminal 802 are parallel or substantially parallel to an xs-axis direction and a ys-axis direction. The connection terminal 801 and the connection terminal 802 are arranged at different positions in the xs-axis direction. The power module 80 includes, for example, an alternating current (AC)-direct current (DC) power converter that converts AC power input from an AC power supply into DC power and outputs the DC power and a DC-DC power converter that converts a voltage of DC power input from a DC power supply into another DC power and outputs the DC power.

The battery module 81, the battery module 82, and the battery module 83 have the same or substantially the same configuration. However, it is sufficient that the battery module 81, the battery module 82, and the battery module 83 have at least the same or substantially the same connection terminal structure. The battery module includes, for example, a power supply module that includes a battery inside and outputs DC power.

The battery module 81 includes a connection terminal 811 and a connection terminal 812 each having a flat plate shape. More specifically, as illustrated in FIGS. 4A and 4B, a flat plate surface of each of the connection terminal 811 and the connection terminal 812 is orthogonal or substantially orthogonal to the vertical direction (zs-axis direction). The connection terminal 811 and the connection terminal 812 are arranged at different positions in the xs-axis direction and are arranged at substantially the same position in the ys-axis direction and in the zs-axis direction. The connection terminal 811 and the connection terminal 812 have the same or substantially the same shapes as those of the first terminal portion 11 and the second terminal portion 12 of the busbar 10.

The connection terminal 811 includes a plurality of through holes 891 passing through the connection terminal 811 in the zs-axis direction. The connection terminal 812 includes a plurality of through holes 892 passing through the connection terminal 812 in the zs-axis direction. A formation pattern of the plurality of through holes 891 and the plurality of through holes 892 is the same or substantially the same as the formation pattern of the plurality of through holes 101 and the plurality of through holes 102 of the busbar 10.

The battery module 82 includes a connection terminal 821 and a connection terminal 822 each having a flat plate shape. A flat plate surface of each of the connection terminal 821 and the connection terminal 822 is orthogonal or substantially orthogonal to the vertical direction (zs-axis direction). The configuration of the connection terminal 821 and the configuration of the connection terminal 822 are the same or substantially the same as the configuration of the connection terminal 811 and the configuration of the connection terminal 812, and specific description thereof will be omitted.

The battery module 83 includes a connection terminal 831 and a connection terminal 832 each having a flat plate shape. A flat plate surface of each of the connection terminal 831 and the connection terminal 832 is orthogonal or substantially orthogonal to the vertical direction (zs-axis direction). The configuration of the connection terminal 831 and the configuration of the connection terminal 832 are the same or substantially the same as the configuration of the connection terminal 811 and the configuration of the connection terminal 812, and specific description thereof will be omitted.

The connection terminal 811 of the battery module 81, the connection terminal 821 of the battery module 82, and the connection terminal 831 of the battery module 83 overlap each other in plan view (when viewed in the zs-axis direction). In other words, the positions of the connection terminal 811, the connection terminal 821, and the connection terminal 831 in the xs-axis direction and in the ys-axis direction are the same or substantially the same.

The connection terminal 812 of the battery module 81, the connection terminal 822 of the battery module 82, and the connection terminal 832 of the battery module 83 overlap each other in plan view (when viewed in the zs-axis direction). In other words, the positions of the connection terminal 812, the connection terminal 822, and the connection terminal 832 in the xs-axis direction and in the ys-axis direction are the same or substantially the same.

Furthermore, in a power supply system 1, the connection terminal 801 of the power module 80 overlaps the connection terminal 811 in plan view (when viewed in the zs-axis direction). In other words, the positions of the connection terminal 801 and the connection terminal 811 in the xs-axis direction and in the ys-axis direction are the same or substantially the same. In addition, in the power supply system 1, the connection terminal 802 of the power module 80 overlaps the connection terminal 812 in plan view (when viewed in the zs-axis direction). In other words, the positions of the connection terminal 802 and the connection terminal 812 in the xs-axis direction and in the ys-axis direction are the same or substantially the same. A positional relationship between the connection terminals of the power module 80 and the connection terminals of the battery modules 81, 82, and 83 is not limited to this relationship.

Connection Mode Between Power Module 80 and Battery Module 81 Positive Electrode Side The connection terminal 801 of the power module 80 and the connection terminal 811 of the battery module 81 are connected to each other by the power supply busbar 71. More specifically, the power supply busbar 71 includes two terminal portions parallel or substantially parallel to the xs-axis direction and the ys-axis direction and a joint portion connecting the terminal portions and extending in the zs-axis direction. A surface of one of the terminal portions of the power supply busbar 71 faces and is in contact with the surface of the connection terminal 801 and is fixed by a plurality of bolts 99 inserted into the plurality of through holes. A surface of the other of the terminal portions of the power supply busbar 71 faces an upper surface (a surface on a power module 80 side) of the connection terminal 811. Since the power supply busbar 71 and the connection terminal 801 are in surface contact with each other, the positional relationship of both is easily fixed, and the operation of fixing the bolt 99 is facilitated.

Negative Electrode Side

The connection terminal 802 of the power module 80 and the connection terminal 812 of the battery module 81 are connected to each other by the power supply busbar 72. More specifically, the power supply busbar 72 includes two terminal portions parallel or substantially parallel to the xs-axis direction and the ys-axis direction and a joint portion connecting the terminal portions and extending in the zs-axis direction. A surface of one of the terminal portions of the power supply busbar 72 faces and is in contact with the surface of the connection terminal 802 and is fixed by a plurality of bolts 99 inserted into the plurality of through holes. A surface of the other of the terminal portions of the power supply busbar 72 faces an upper surface (a surface on the power module 80 side) of the connection terminal 812.

Connection Mode Between Battery Module 81 and Battery Module 82 Positive Electrode Side The connection terminal 811 (corresponding to "first connection terminal") of the battery module 81 and the connection terminal 821 (corresponding to "second connection terminal") of the battery module 82 are connected to each other by the busbar 10A1. As illustrated in FIG. 5, more specifically, the flat plate surface 112 of the first terminal portion 11 of the busbar 10A1 faces and is in contact with the surface of the power supply busbar 71. That is, with respect to the connection terminal 811, the other terminal portion of the power supply busbar 71 is arranged on and is in contact with the upper surface (corresponding to "first surface") of the connection terminal 811, and the first terminal portion 11 of the busbar 10A1 is arranged on and is in contact with the other terminal portion of the power supply busbar 71. The connection terminal 811, the other terminal portion of the power supply busbar 71, and the first terminal portion 11 of the busbar 10A1 are fixed by the plurality of bolts 99 inserted into the plurality of through holes.

The flat plate surface 121 of the second terminal portion 12 of the busbar 10A1 faces and is in contact with an upper surface of the connection terminal 821 (a surface on a battery module 81 side with respect to the battery module 82 (corresponding to "second surface")). That is, the second terminal portion 12 of the busbar 10A1 is in direct contact with the connection terminal 821. The flat plate surface 112 of the first terminal portion 11 of the busbar 10B1, which will be described later, faces and is in contact with the flat plate surface 122 of the second terminal portion 12. The connection terminal 821, the second terminal portion 12 of the busbar 10A1, and the first terminal portion 11 of the busbar 10B1 are fixed by the plurality of bolts 99 inserted into the plurality of through holes.

At this time, the busbar 10A1 is arranged such that the joint portion 13 is on the side opposite to the joint portion of the power supply busbar 71 in the xs-axis direction with respect to the connection terminal 811.

Negative Electrode Side

The connection terminal 812 (corresponding to "first connection terminal") of the battery module 81 and the connection terminal 822 (corresponding to "second connection terminal") of the battery module 82 are connected to each other by the busbar 10A2. To be more specific, the flat plate surface 112 of the first terminal portion 11 of the busbar 10A2 faces and is in contact with a surface of the power supply busbar 72. The power supply busbar 72 is in contact with the upper surface (corresponding to "first surface") of the connection terminal 812. The connection terminal 812, the other terminal portion of the power supply busbar 72, and the first terminal portion 11 of the busbar 10A2 are fixed by the plurality of bolts 99 inserted into the plurality of through holes.

The flat plate surface 121 of the second terminal portion 12 of the busbar 10A2 faces and is in contact with an upper surface of the connection terminal 822 (a surface (the "second surface") on the battery module 81 side with respect to the battery module 82). That is, the second terminal portion 12 of the busbar 10A2 is in direct contact with the connection terminal 822. The flat plate surface 112 of the first terminal portion 11 of the busbar 10B2, which will be described later, faces and is in contact with the flat plate surface 122 of the second terminal portion 12. The connection terminal 822, the second terminal portion 12 of the busbar 10A2, and the first terminal portion 11 of the busbar 10B2 are fixed by the plurality of bolts 99 inserted into the plurality of through holes.

At this time, the busbar 10A2 is arranged such that the joint portion 13 is on the side opposite to the joint portion of the power supply busbar 72 in the xs-axis direction with respect to the connection terminal 812.

Connection Mode Between Battery Module 82 and Battery Module 83 Positive Electrode Side The connection terminal 821 (corresponding to "second connection terminal") of the battery module 82 and the connection terminal 831 (corresponding to "third connection terminal") of the battery module 83 are connected to each other by the busbar 10B1. To be more specific, the flat plate surface 112 of the first terminal portion 11 of the busbar 10B1 faces the surface of the connection terminal 821 and the surface of the second terminal portion 12 of the busbar 10A1 and is in contact with the second terminal portion 12 of the busbar 10A1. That is, with respect to the connection terminal 821, the second terminal portion 12 of the busbar 10A1 is arranged on and is in contact with the upper surface (corresponding to "second surface") of the connection terminal 821, and the first terminal portion 11 of the busbar 10B1 is arranged on and is in contact with the second terminal portion 12 of the busbar 10A1. That is, the first terminal portion 11 of the busbar 10B1 is in indirect contact with the connection terminal 821. The connection terminal 821, the second terminal portion 12 of the busbar 10A1, and the first terminal portion 11 of the busbar 10B1 are fixed by the plurality of bolts 99 inserted into the plurality of through holes.

The flat plate surface 121 of the second terminal portion 12 of the busbar 10B1 faces and is in contact with an upper surface of the connection terminal 831 (a surface (corresponding to "third surface") on a battery module 82 side with respect to the battery module 83). That is, the second terminal portion 12 of the busbar 10B1 is in direct contact with the connection terminal 831. The connection terminal 831 and the second terminal portion 12 of the busbar 10B1 are fixed by the plurality of bolts 99 inserted into the plurality of through holes.

At this time, the busbar 10B1 is arranged such that the joint portion 13 is on the side opposite to the joint portion of the busbar 10A1 in the xs-axis direction with respect to the connection terminal 821.

Negative Electrode Side

The connection terminal 822 (corresponding to "second connection terminal") of the battery module 82 and the connection terminal 832 (corresponding to "third connection terminal") of the battery module 83 are connected to each other by the busbar 10B2. To be more specific, the flat plate surface 112 of the first terminal portion 11 of the busbar 10B2 faces the surface of the connection terminal 822 and the surface of the second terminal portion 12 of the busbar 10A2 and is in contact with the second terminal portion 12 of the busbar 10A2. That is, with respect to the connection terminal 822, the second terminal portion 12 of the busbar 10A2 is arranged on and is in contact with the upper surface (corresponding to "second surface") of the connection terminal 822, and the first terminal portion 11 of the busbar 10B2 is arranged on and is in contact with the second terminal portion 12 of the busbar 10A2. That is, the first terminal portion 11 of the busbar 10B2 is in indirect contact with the connection terminal 822. The connection terminal 822, the second terminal portion 12 of the busbar 10A2, and the first terminal portion 11 of the busbar 10B2 are fixed by the plurality of bolts 99 inserted into the plurality of through holes.

The flat plate surface 121 of the second terminal portion 12 of the busbar 10B2 faces and is in contact with an upper surface of the connection terminal 832 (the surface (corresponding to "third surface") on the battery module 82 side with respect to the battery module 83). That is, the second terminal portion 12 of the busbar 10B2 is in direct contact with the connection terminal 832. The connection terminal 832 and the second terminal portion 12 of the busbar 10B2 are fixed by the plurality of bolts 99 inserted into the plurality of through holes.

At this time, the busbar 10B2 is arranged such that the joint portion 13 is on the side opposite to the joint portion of the busbar 10A2 in the xs-axis direction with respect to the connection terminal 822.

As described above, in the configuration of the present preferred embodiment, three or more battery modules 81, 82, and 83 are connected to each other by the plurality of busbars 10A1, 10A2, 10B1, and 10B2. The plurality of busbars 10A1, 10A2, 10B1, and 10B2 have the same or substantially the same shape. Thus, an operator can easily connect the plurality of battery modules 81, 82, and 83 to each other.

In particular, since each of the plurality of busbars 10A1, 10A2, 10B1, and 10B2 has a shape including a bend provided by bending a flat plate at two positions, the plurality of connection terminals arranged at equal or substantially equal intervals can be easily connected to each other by arranging the busbars such that the directions of the bends are sequentially reversed.

In this configuration, each of the connection portions of the busbars 10A1, 10A2, 10B1, and 10B2 and the connecting surfaces of the connection terminals of the battery modules 81, 82, and 83 are orthogonal or substantially orthogonal to the vertical direction. Accordingly, when fixing the busbars 10A1, 10A2, 10B1, and 10B2 to the connection terminals of the battery modules 81, 82, and 83 with the bolts 99, an operator may insert the bolts 99 into the through holes from above. Therefore, a fixing operation can be easily performed, and the bolt 99 can be prevented from falling off during the fixing operation.

In addition, since the shape of the busbar is one type, it is possible to achieve cost reduction as the power supply system 1, and it is possible for an operator to easily perform the connecting operation without hesitation.

In this configuration, the busbar 10A1 and the busbar 10B1 are directly connected to each other, and the busbar 10A2 and the busbar 10B2 are directly connected to each other. As a result, it is possible to prevent a current path from being unnecessarily long and to reduce or prevent transmission loss of a current.

Figure 6:
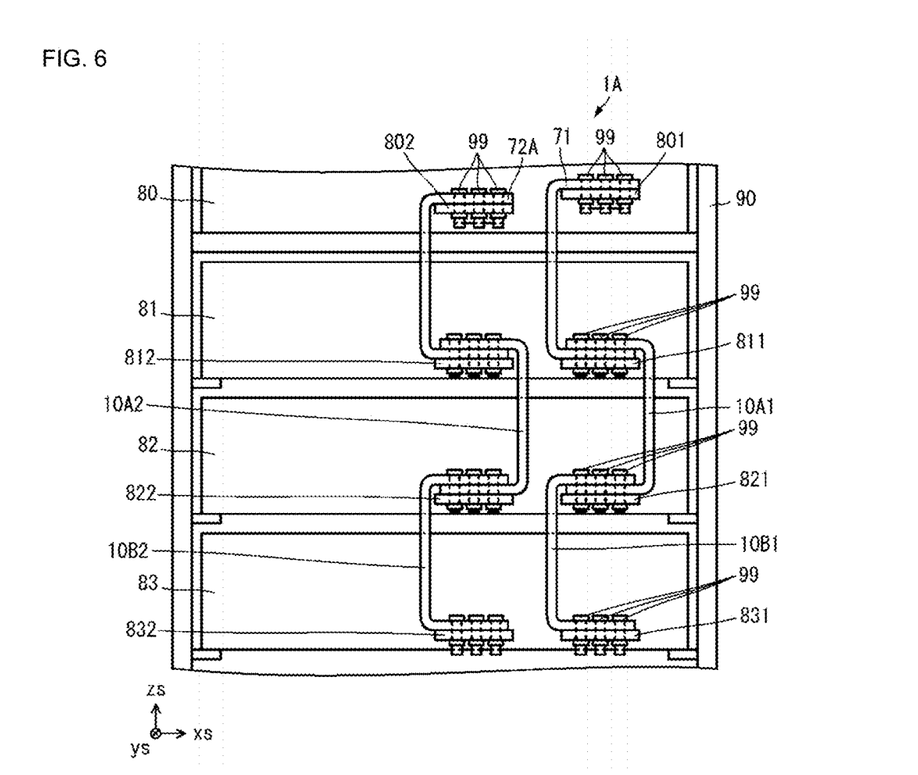
FIG. 6 is a diagram illustrating a portion of another configuration of the power supply system according to the first preferred embodiment of the present invention.

In addition, in this configuration, the busbars are fixed to the connection terminals in order from the busbar closest to the power module 80. Therefore, when a battery module is newly added, an additional busbar can be easily installed.
Another Connection Mode Configuration of Power Supply System FIG. 6 is a diagram illustrating a portion of another configuration of the power supply system according to the first preferred embodiment of the present invention. As illustrated in FIG. 6, a power supply system 1A according to the first preferred embodiment is different from the power supply system 1 according to the first preferred embodiment in the connection configuration on a negative electrode side. Other configurations of the power supply system 1A are the same as or similar to those of the power supply system 1, and the description of the same or similar portions is omitted.

In the power supply system 1A, the connection terminal 802 of the power modules 80 and the battery module 81 are connected by the power supply busbar 72A. The power supply busbar 72A is arranged such that the joint portion is on the side opposite to a connection terminal 801 side with respect to the connection terminal 802.

In this case, the busbar 10A2 is arranged such that the joint portion 13 is on a connection terminal 811 side with respect to the connection terminal 812. In addition, the busbar 10B2 is arranged such that the joint portion 13 is on the side opposite to a connection terminal 821 side with respect to the connection terminal 822.

As described above, by using the configurations of preferred embodiments of the present invention, it is possible to easily connect the plurality of battery modules 81, 82, and 83 by adjusting the arrangement of the plurality of busbars in accordance with the arrangement of the power supply busbars. That is, the plurality of battery modules 81, 82, and 83 can be easily connected according to the arrangement of the power supply busbars without changing the shape of the busbars.

Second Preferred Embodiment

Figure 7A:
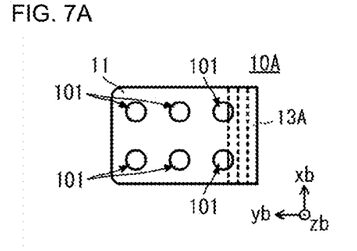
FIGS. 7A to 7E are five-sided views of a busbar according to a second preferred embodiment of the present invention.
Figure 7B:
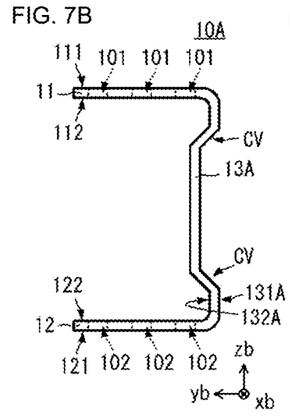
Figure 7C:
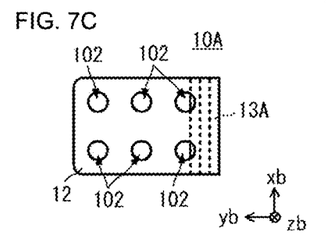
Figure 7D:
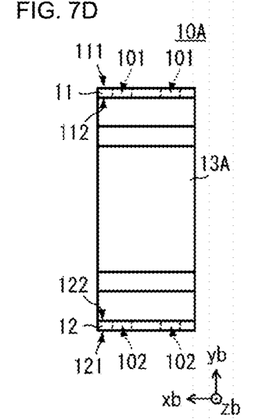
Figure 7E:
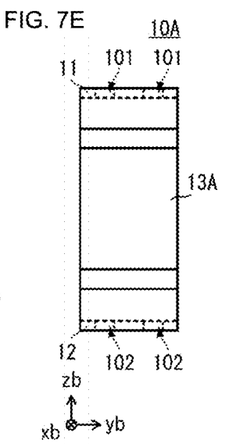

A configuration of a busbar in a power supply system according to a second preferred embodiment of the present invention will be described with reference to the accompanying drawings. FIGS. 7A to 7E are five-sided views of the busbar according to the second preferred embodiment. FIG. 7A is a first plan view, FIG. 7B is a first side view, FIG. 7C is a second plan view, FIG. 7D is a second side view, and FIG. 7E is a third side view.

As illustrated in FIGS. 7A to 7E, a busbar 10A according to the second preferred embodiment is different from the busbar 10 according to the first preferred embodiment in a configuration of a joint portion 13A. Other configurations of the busbar 10A are the same as or similar to those of the busbar 10, and the description of the same or similar portions is omitted.

The joint portion 13A includes a plurality of bending portions CV. That is, the joint portion 13A has a clamp shape and corresponds to "adjustment portion". With such a configuration, the joint portion 13A can adjust a distance between the first terminal portion 11 and the second terminal portion 12 by an external force. Accordingly, even when there is a variation in a distance between the connection terminals of the plurality of adjacent battery modules, the connection terminals of the plurality of battery modules can be more reliably connected to each other.

In the busbar 10A, the joint portion 13A includes the plurality of bending portions CV so as to be recessed toward the first terminal portion 11 side and the second terminal portion 12 side (toward a surface 132A side). However, the joint portion 13A may have a shape recessed toward a surface 131A side (bulging outward). Provided that the shape is provided so as to be recessed toward the surface 132A side, the clamp shape can be obtained without changing the size of the outermost shape of the busbar 10A.

In the above description, the configuration to obtain the adjustment portion with the clamp shape has been described. However, the structure is not limited to the clamp shape and can be applied to the joint portion 13A as long as the distance between the first terminal portion 11 and the second terminal portion 12 can be adjusted.

Figure 8:
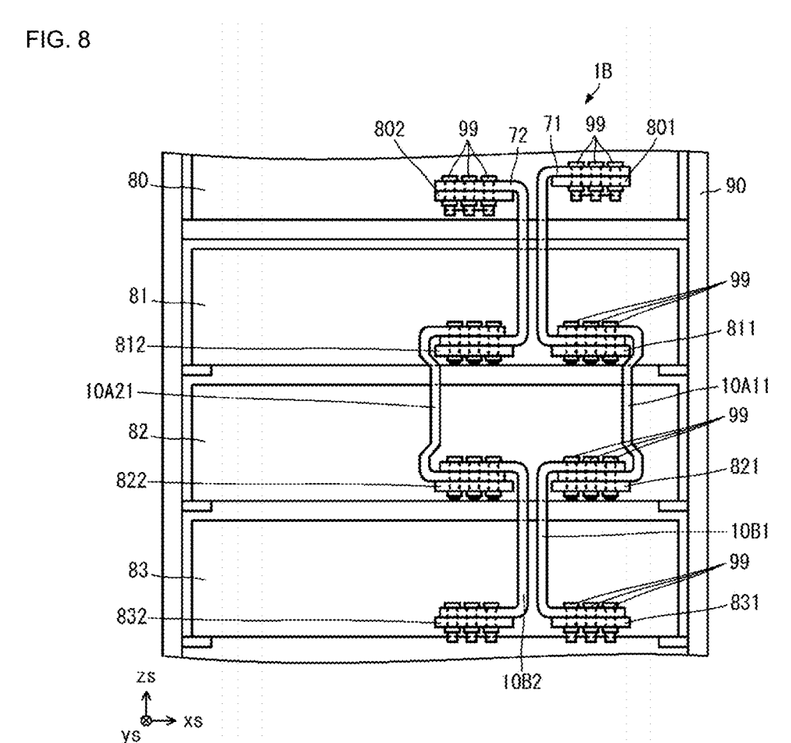
FIG. 8 is a diagram illustrating an example of a connection configuration of the busbar according to the second preferred embodiment of the present invention.

FIG. 8 is a diagram illustrating an example of a connection mode of the busbar according to the second preferred embodiment.

As illustrated in FIG. 8, a power supply system 1B according to the second preferred embodiment is different from the power supply system 1 according to the first preferred embodiment illustrated in FIG. 3 in that the busbar 10A1 is replaced with a busbar 10A11 and the busbar 10A2 is replaced with a busbar 10A21. Other configurations of the power supply system 1B are the same as or similar to those of the power supply system 1, and the description of the same or similar portions is omitted.

The busbar 10A11 and the busbar 10A21 have the configuration of the busbar 10A.

Positive Electrode Side

The connection terminal 811 of the battery module 81 and the connection terminal 821 of the battery module 82 are connected by the busbar 10A11. As illustrated in FIG. 8, more specifically, the flat plate surface 112 of the first terminal portion 11 of the busbar 10A11 faces and is in contact with the surface of the power supply busbar 71. That is, with respect to the connection terminal 811, the other terminal portion of the power supply busbar 71 is arranged on and in contact with the connection terminal 811, and the first terminal portion 11 of the busbar 10A11 is arranged on and in contact with the other terminal portion of the power supply busbar 71. The connection terminal 811, the other terminal portion of the power supply busbar 71, and the first terminal portion 11 of the busbar 10A11 are fixed by the plurality of bolts 99 inserted into the plurality of through holes.

The flat plate surface 121 of the second terminal portion 12 of the busbar 10A11 faces and is in contact with the upper surface (the surface on the battery module 81 side with respect to the battery module 82) of the connection terminal 821. The flat plate surface 112 of the first terminal portion 11 of the busbar 10B1, which will be described later, faces and is in contact with the flat plate surface 122 of the second terminal portion 12. The connection terminal 821, the second terminal portion 12 of the busbar 10A11, and the first terminal portion 11 of the busbar 10B1 are fixed by the plurality of bolts 99 inserted into the plurality of through holes.

At this time, the busbar 10A11 is arranged such that the joint portion 13 is on the side opposite to the joint portion of the power supply busbar 71 in the xs-axis direction with respect to the connection terminal 811.

Negative Electrode Side

The connection terminal 812 of the battery module 81 and the connection terminal 822 of the battery module 82 are connected by the busbar 10A21. To be more specific, the flat plate surface 112 of the first terminal portion 11 of the busbar 10A21 faces and is in contact with the surface of the power supply busbar 72. The connection terminal 812, the other terminal portion of the power supply busbar 72, and the first terminal portion 11 of the busbar 10A21 are fixed by the plurality of bolts 99 inserted into the plurality of through holes.

The flat plate surface 121 of the second terminal portion 12 of the busbar 10A21 faces and is in contact with the upper surface (the surface on the battery module 81 side with respect to the battery module 82) of the connection terminal 822. The flat plate surface 112 of the first terminal portion 11 of the busbar 10B2, which will be described later, faces and is in contact with the flat plate surface 122 of the second terminal portion 12. The connection terminal 822, the second terminal portion 12 of the busbar 10A21, and the first terminal portion 11 of the busbar 10B2 are fixed by the plurality of bolts 99 inserted into the plurality of through holes.

At this time, the busbar 10A21 is arranged such that the joint portion 13 is on the side opposite to the joint portion of the power supply busbar 72 in the xs-axis direction with respect to the connection terminal 812.

As described above, in the power supply system 1B, the plurality of battery modules 81 and 82 are connected using the busbar 10A11 and the busbar 10A21 having the shape of the busbar 10A, and the plurality of battery modules 82 and 83 are connected using the busbar 10B1 and the busbar 10B2 having the shape of the busbar 10.

Therefore, in the power supply system 1B, as long as a busbar includes the first terminal portion 11 and the second terminal portion 12 and the positional relationship between the first terminal portion 11 and the second terminal portion 12 is the same or substantially the same, the busbar can be used as a busbar of a similar type for connecting the plurality of battery modules 81, 82, and 83 even when the shape of the joint portion is different.

The power supply system 1B can obtain more various connection configurations in accordance with the arrangement state and the like of the plurality of battery modules 81, 82, and 83, by using the busbar not exactly of the same type, but of a similar type in the above-described concept.

In the present preferred embodiment, described is the busbars having the same or substantially the same shape are used on the positive electrode side and the negative electrode side. However, busbars having different shapes on the positive electrode side and the negative electrode side may be used.

Third Preferred Embodiment

Figure 9A:
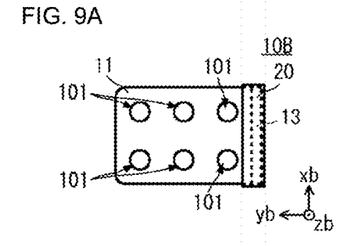
FIGS. 9A to 9E are five-sided views of a busbar according to a third preferred embodiment of the present invention.
Figure 9B:
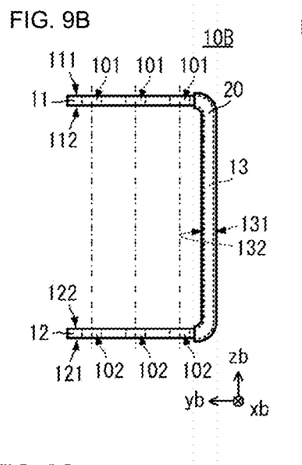
Figure 9C:
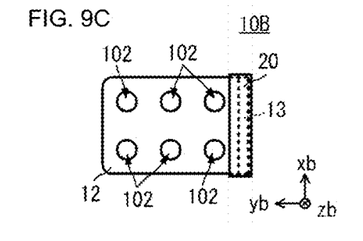
Figure 9D:
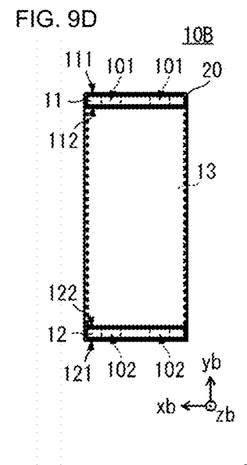
Figure 9E:
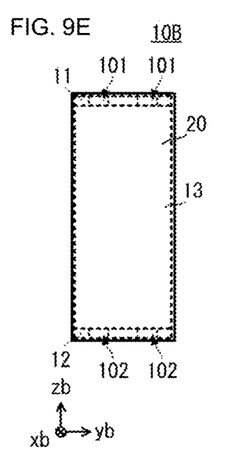

A configuration of a busbar in a power supply system according to a third preferred embodiment of the present invention will be described with reference to the accompanying drawings. FIGS. 9A to 9E are five-sided views of the busbar according to the third preferred embodiment. FIG. 9A is a first plan view, FIG. 9B is a first side view, FIG. 9C is a second plan view, FIG. 9D is a second side view, and FIG. 9E is a third side view.

As illustrated in FIGS. 9A to 9E, a busbar 10B according to the third preferred embodiment is different from the busbar 10 according to the first preferred embodiment in that an insulating film 20 is added. Other configurations of the busbar 10B are the same as or similar to those of the busbar 10, and the description of the same or similar portions is omitted.

The busbar 10B includes the insulating film 20. The insulating film 20 covers an entirety or substantially an entirety of the surface of the joint portion 13. In addition, the insulating film 20 covers a connection portion of the first terminal portion 11 to the joint portion 13 and a region near the connection portion and covers a connection portion of the second terminal portion 12 to the joint portion 13 and a region near the connection portion.

With such a configuration, the busbar 10B can reduce or prevent short-circuiting of the joint portion 13 with other circuit components or the joint portion 13 of other busbars. Thus, a highly reliable power supply system can be obtained.

The insulating film 20 may be provided at least on a flat plate surface 131 side of the joint portion 13. As a result, an advantageous effect of reducing or preventing short-circuiting at least with external circuit components or other busbars may substantially be obtained.

In the above description, the shape of the power supply busbar connecting the power module 80 and the battery module 81 has been described to be the same as or similar to the shape of the busbar connecting the plurality of battery modules. However, the shape of the power supply busbar can be appropriately set in accordance with a relationship of an arrangement position between the power module 80 and the battery module 81, an installation mode on the rack 90, and the like. For example, the power supply busbar may have another shape such as an L-shape, and the power module 80 and the plurality of battery modules can be easily connected by appropriately adjusting the orientation of the busbar according to the arrangement mode of the L-shaped power supply busbar.

In addition, the configurations of the above-described preferred embodiments can be appropriately combined with each other, and it is possible to achieve advantageous operational effects according to each combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply system, comprising:
    a plurality of power supply modules positioned side by side in order of a first power supply module, a second power supply module, and a third power supply module in a predetermined direction;
    a first busbar connecting the first power supply module and the second power supply module; and
    a second busbar connecting the second power supply module and the third power supply module; wherein
    the first power supply module includes a first connection terminal including a first surface orthogonal or substantially orthogonal to the predetermined direction;
    the second power supply module includes a second connection terminal including a second surface orthogonal or substantially orthogonal to the predetermined direction;
    the third power supply module includes a third connection terminal includes a third surface orthogonal or substantially orthogonal to the predetermined direction;
    each of the first busbar and the second busbar includes:
        a first terminal portion and a second terminal portion each including a pair of surfaces opposed to each other; and
        a joint portion connecting the first terminal portion and the second terminal portion such that a surface of the first terminal portion and a surface of the second terminal portion face each other;
    the first busbar is positioned such that the surface of the first terminal portion of the first busbar is in contact with the first surface of the first connection terminal and another surface of the second terminal portion of the first busbar is in direct or indirect contact with the second surface of the second connection terminal;
    the second busbar is positioned such that the surface of the first terminal portion of the second busbar is in direct or indirect contact with the second surface of the second connection terminal and another surface of the second terminal portion of the second busbar is in direct or indirect contact with the third surface of the third connection terminal; and
    the joint portion of the first busbar and the joint portion of the second busbar sandwich the first connection terminal, the second connection terminal, and the third connection terminal in a direction parallel to the first surface.

2. The power supply system according to claim 1, wherein the surface of the second terminal portion of the first busbar and the surface of the first terminal portion of the second busbar face each other.

3. The power supply system according to claim 1, wherein the predetermined direction is a vertical direction; and
    the surfaces of the first terminal portion, the surfaces of the second terminal portion, and surfaces of a third terminal portion are orthogonal or substantially orthogonal to the vertical direction.

4. The power supply system according to claim 1, wherein the joint portion of the first busbar and the joint portion of the second busbar connecting the plurality of power supply modules have a same or substantially a same length in the predetermined direction; and
    the surface of the first terminal portion is in direct contact with one of the connection terminals of the plurality of power supply modules, and a surface of a second terminal is in indirect contact with one of the connection terminals of the plurality of power supply modules.

5. The power supply system according to claim 1, further comprising:
    a plurality of battery modules including the first power supply module, the second power supply module, and the third power supply module;
    a power module extending in the predetermined direction and being adjacent to the first power supply module or the third power supply module; and
    a power module busbar connecting the power module and one of the plurality of battery modules; wherein
    lengths of the joint portion of the first busbar and the joint portion of the second busbar in the predetermined direction are different from a length of a joint portion of the power module busbar in the predetermined direction.

6. The power supply system according to claim 1, wherein the joint portion includes an adjustment portion to adjust a distance between the first terminal portion and the second terminal portion.

7. The power supply system according to claim 6, wherein the adjustment portion has a clamp shape in the joint portion.

8. The power supply system according to claim 1, wherein an insulating film on a surface of the joint portion is provided.

9. The power supply system according to claim 8, wherein the insulating film covers at least an entirety or substantially an entirety of a surface of the joint portion on a side opposite to a side on which the first terminal portion and the second terminal portion are provided.

10. A connection structure between a connection terminal and a busbar, the connection structure comprising:
    a plurality of connection terminals positioned side by side in order of a first connection terminal, a second connection terminal, and a third connection terminal in a predetermined direction;
    a first busbar connecting the first connection terminal and the second connection terminal; and
    a second busbar connecting the second connection terminal and the third connection terminal; wherein
    the first connection terminal includes a first surface orthogonal or substantially orthogonal to the predetermined direction;
    the second connection terminal includes a second surface orthogonal or substantially orthogonal to the predetermined direction;
    the third connection terminal includes a third surface orthogonal or substantially orthogonal to the predetermined direction;

each of the first busbar and the second busbar includes:
- a first terminal portion and a second terminal portion each including a pair of surfaces opposed to each other; and
- a joint portion connecting the first terminal portion and the second terminal portion such that a surface of the first terminal portion and a surface of the second terminal portion face each other;

the first busbar is positioned such that the surface of the first terminal portion of the first busbar is in contact with the first surface of the first connection terminal and another surface of the second terminal portion of the first busbar is in direct or indirect contact with the second surface of the second connection terminal;

the second busbar is positioned such that the surface of the first terminal portion of the second busbar is in direct or indirect contact with the second surface of the second connection terminal and another surface of the second terminal portion of the second busbar is in direct or indirect contact with the third surface of the third connection terminal; and the joint portion of the first busbar and the joint portion of the second busbar sandwich the first connection terminal, the second connection terminal, and the third connection terminal in a direction parallel or substantially parallel to the first surface.

11. The connection structure according to claim 10, wherein the surface of the second terminal portion of the first busbar and the surface of the first terminal portion of the second busbar face each other.

12. The connection structure according to claim 10, wherein the predetermined direction is a vertical direction; and the surfaces of the first terminal portion, the surfaces of the second terminal portion, and surfaces of a third terminal portion are orthogonal or substantially orthogonal to the vertical direction.

13. The connection structure according to claim 10, wherein the joint portion of the first busbar and the joint portion of the second busbar connecting the plurality of connection terminals have a same or substantially a same length in the predetermined direction; and the surface of the first terminal portion is in direct contact with one of the plurality of connection terminals, and a surface of a second terminal is in indirect contact with one of the plurality of connection terminals.

14. The connection structure according to claim 10, wherein the joint portion includes an adjustment portion to adjust a distance between the first terminal portion and the second terminal portion.

15. The connection structure according to claim 14, wherein the adjustment portion has a clamp shape in the joint portion.

16. The connection structure according to claim 10, wherein an insulating film on a surface of the joint portion is provided.

17. The power supply system according to claim 16, wherein the insulating film covers at least an entirety or substantially an entirety of a surface of the joint portion on a side opposite to a side on which the first terminal portion and the second terminal portion are provided.

\* \* \* \* \*